United States Patent [19]
Sato

[11] Patent Number: 5,239,367
[45] Date of Patent: Aug. 24, 1993

[54] SIGNAL DISCRIMINATING CIRCUIT AND ACTIVE FILTER USING SAME
[75] Inventor: Katsunori Sato, Kanagawa, Japan
[73] Assignee: Sony Corporation, Tokyo, Japan
[21] Appl. No.: 748,046
[22] Filed: Aug. 21, 1991
[30] Foreign Application Priority Data
Aug. 22, 1990 [JP] Japan .................................... 220312
[51] Int. Cl.⁵ .............................................. H04N 5/46
[52] U.S. Cl. .................... 358/21 R; 358/38; 358/11
[58] Field of Search ............... 358/188, 158, 139, 148, 358/191.1, 139, 38, 21 R, 11; 331/1 A, 20, 23, 25

[56] References Cited
U.S. PATENT DOCUMENTS 4,688,082 8/1987 Kato et al. .
4,860,098 8/1989 Murphy .......................... 358/188 X
5,072,298 12/1991 Sumiyoshi ...................... 358/158 X
5,119,177 6/1992 Lim ..................................... 358/11 X Primary Examiner—Victor R. Kostak
Attorney, Agent, or Firm—Jay H. Maioli; Lewis H. Eslinger

[57] ABSTRACT

An NTSC/PAL signal discriminating circuit automatically adjusts the trap center frequency of an active filter in accordance with the frequency of an input signal. The discriminating circuit operates to generate a signal of an amplitude corresponding to the frequency of an input signal and discriminating, in accordance with the amplitude of the signal thus generated, whether the input signal is a subcarrier signal of the NTSC format or that of the PAL format. The trap center frequency of the active filter is then adjusted in accordance with such discrimination output, and the value of a correction signal for switching the operation mode of a chrominance synchronizing circuit and so forth; wherein automatic adjustment is executed to perform a predetermined operation in each mode of the NTSC and PAL signals without the necessity of inputting any external NTSC/PAL switching signal.

7 Claims, 3 Drawing Sheets

SIGNAL DISCRIMINATING CIRCUIT AND ACTIVE FILTER USING SAME

BACKGROUND OF THE INVENTION

1. Field of the Invention

The present invention relates to an NTSC/PAL signal discriminating circuit and an active filter using such a circuit, and more particularly to a device adapted for automatically adjusting the trap center frequency of an active filter and trap frequency in accordance with the frequency of an input signal.

2. Description of the Prior Art

It is generally known that a variety of circuits have been contrived for automatically adjusting the trap center frequency $f_o$ of an IC active filter employed in an electronic apparatus such as a television receiver or a video tape recorder. A typical conventional circuit for achieving automatic adjustment of the trap center frequency is so formed that a reference signal is fed to a filter or an integrator or the like constituting the filter, and a phase detection or a level comparison is executed with regard to the output of the filter and the reference signal to obtain an error signal. The voltage of such error signal is fed back to automatically adjust the trap center frequency $f_o$ of the active filter. An exemplary configuration of such automatic frequency adjusting circuit is shown in FIG. 1.

In this diagram, an input signal $S_{in}$ fed to an input terminal $T_{in}$ is supplied to both a reference filter 1 and a phase detector 2. The signal $S_1$ produced by shifting the phase of the input signal $S_{in}$ by 90° in the reference filter 1 is supplied to the phase detector 2, where the difference in phases of such two signals $S_{in}$ and $S_1$ is detected. The voltage on a charge/discharge capacitor C, i.e., the voltage at a point A in FIG. 1, is controlled in accordance with the phase detection output thus produced. The point-A voltage is applied to an inverting input terminal of a comparator 3. Meanwhile, a reference voltage $V_{ref}$ is applied to a non-inverting input terminal of the comparator 3, where the point-A voltage is compared with the reference voltage $V_{ref}$ to produce an error detection signal $S_2$. The error detection signal $S_2$ thus obtained from the comparator 3 is then fed back to the reference filter 1 to thereby control the operation of the reference filter 1 in such a manner that the point-A potential is corrected to a predetermined value, i.e., the error is reduced to zero.

The error detection signal $S_2$ is supplied to an active filter 4 which is to be adjusted, so that the center frequency $f_o$ of the active filter 4 is automatically adjusted.

A chrominance subcarrier signal $f_{sc}$ can be used as the aforementioned reference signal. Since the frequency of such subcarrier signal $f_{sc}$ is different depending on the NTSC system or the PAL system, it is clear that the trap center frequency $f_o$ of the active filter 4 to be adjusted is also different in each mode. Therefore, in an exemplary case where the reference filter 1 is such that the phase is shifted by 90° at a frequency of 3.58 MHz, the center frequency $f_o$ of the active filter 4 is adjusted at 4 MHz for example. In this state, when a subcarrier signal $f_{sc}$ of the PAL format is input to the circuit of FIG. 1, the reference filter 1 is balanced at a point with a 90° phase shift at 4.43 MHz, so that the trap center frequency of the active filter 4 to be adjusted is deviated from the desired value as follows:

$$f_{Trap}(PAL) = 4\ MHz \times 4.43/3.58 = 4.95\ MHz \quad (1)$$

For preventing such a disadvantage, it is necessary to add or subtract the offset component, which is derived from the difference between the NTSC and PAL formats, to or from the signal for controlling either the reference filter 1 or the active filter 4. And consequently it has been necessary heretofore to input an external switching signal for executing the above action.

OBJECT AND SUMMARY OF THE INVENTION

It is an object of the present invention to provide an improved signal discriminating circuit and an active filter using such a circuit, wherein adjusting the trap and center frequency of the active filter and switching the operation mode of a chrominance synchronizing circuit and so forth can be performed automatically without the necessity of inputting any external NTSC/PAL switching signal.

According to one aspect of the present invention, there is provided an active filter with a signal discriminating circuit which comprises a means for generating a signal of an amplitude corresponding to the frequency of an input signal and discriminating, in accordance with the amplitude of the signal thus generated, whether the input signal is a subcarrier signal of the NTSC format or that of the PAL format; and a means for adjusting the trap and center frequency of the active filter in accordance with such discrimination output, and varying the value of a correction signal for switching the operation mode of a chrominance synchronizing circuit and so forth. In this constitution, automatic adjustment is executed to perform a predetermined operation in each mode of the NTSC and PAL signals.

The above and other features and advantages of the present invention will become apparent from the following description which will be given with reference to the illustrative accompanying drawings.

DESCRIPTION OF THE PREFERRED EMBODIMENT

Figure 1:
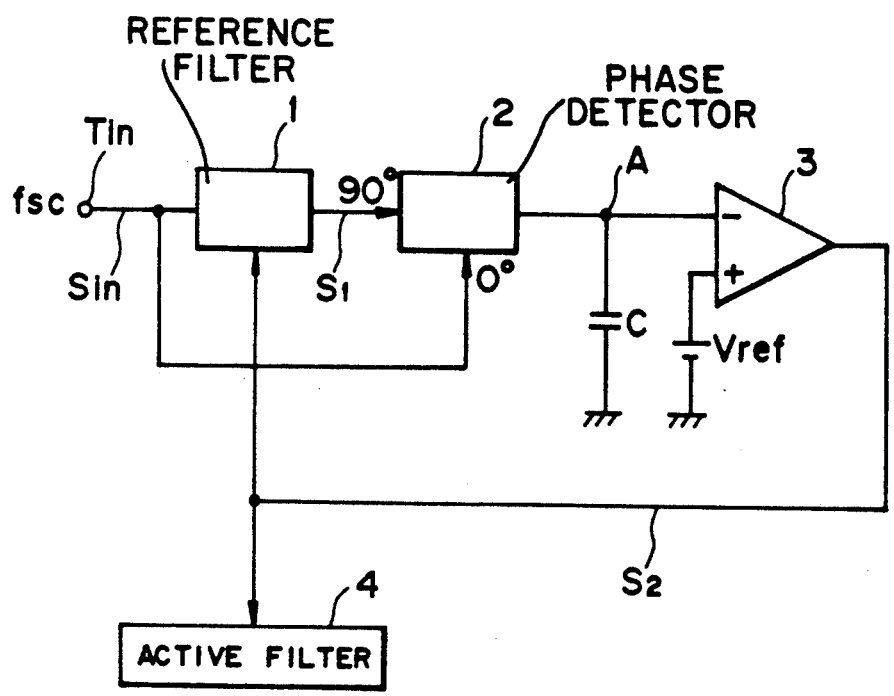
FIG. 1 is a block diagram of an exemplary circuit configuration for automatically adjusting the center frequency of a conventional active filter.

Hereinafter a preferred embodiment of the present invention will be described in detail with reference to a block diagram of FIG. 2.

As seen from this diagram, an automatic adjusting circuit for the trap and center frequency of an active filter according to this embodiment comprises an input signal detector 11, a correction output generator 14 and an input signal discriminator 13, wherein the center frequency $f_o$ of an active filter 20 is automatically adjusted in conformity with the frequency of a reference signal $f_{sc}$ fed to an input terminal $T_{in}$.

More specifically, as mentioned above, the input terminal $T_{in}$ is fed with a chrominance subcarrier signal $f_{sc}$ as a reference signal in the same manner as in the conventional circuit. The reference signal is supplied to both a reference filter 15 constituting the input signal detector 11 and a phase detector 16. The reference filter 15 serves to shift the phase of the input reference signal $f_{sc}$ by 90° and outputs the phase-shifted signal to the phase detector 16. Since an operation control signal $S_{12}$ is supplied to the reference filter 15, the phase shift is performed under control with accuracy.

Figure 2:
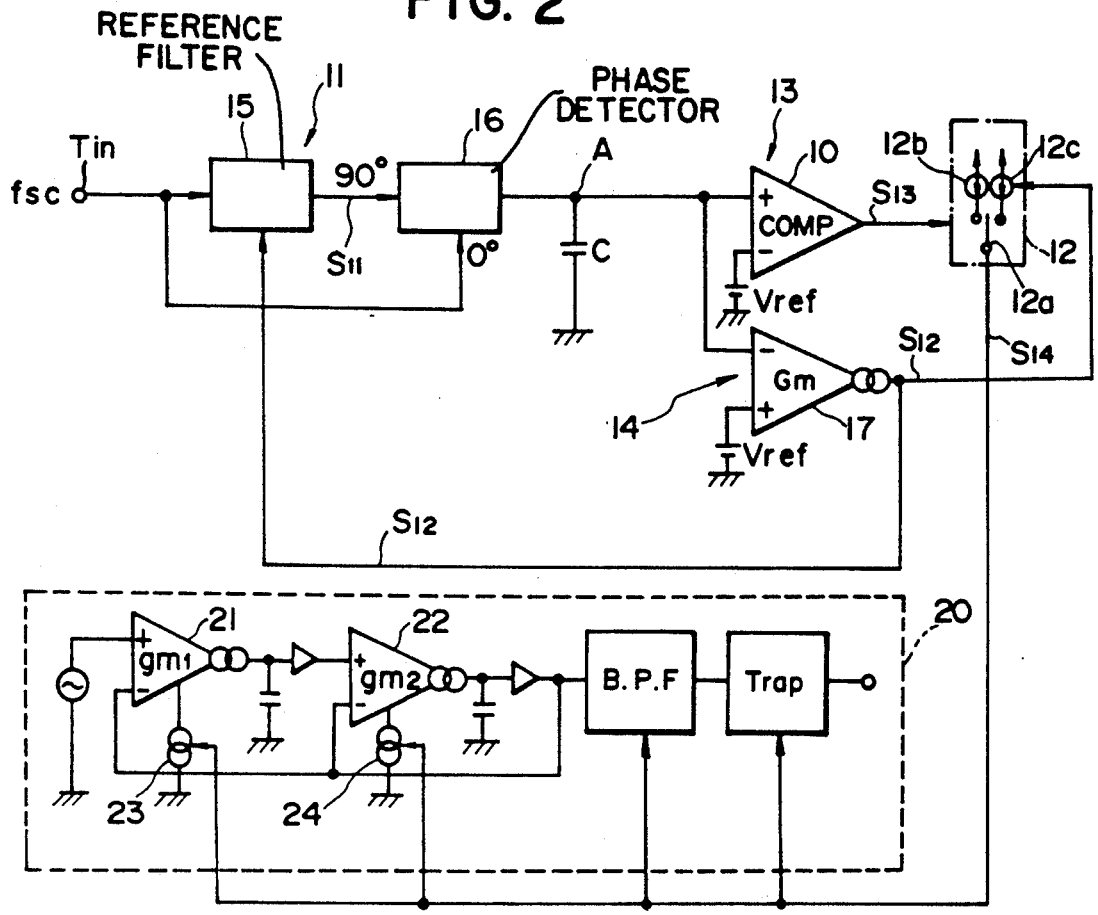
FIG. 2 is a block diagram of a circuit configuration for automatically adjusting the trap and center frequency of an active filter embodying the present invention.

The phase detector 16 controls the voltage on a charge/discharge capacitor C, i.e., the voltage at point A in FIG. 2, in accordance with the frequency of the input subcarrier signal $f_{sc}$ and that of the signal $S_{11}$ having a 90° phase shift from the subcarrier signal $f_{sc}$. Thus, when the subcarrier signal $f_{sc}$ fed to the input terminal $T_{in}$ is based on the NTSC format, the point-A voltage is controlled to 1.9 volts. Meanwhile, if the subcarrier signal $f_{sc}$ fed to the input terminal $T_{in}$ is based on the PAL format, the point-A voltage is controlled to 3.1 volts.

In this manner, the point-A voltage controlled in conformity with the frequency of the input subcarrier signal $f_{sc}$ is supplied to an inverting input terminal (−) of a variable transconductance amplifier (hereinafter referred to as variable Gm amplifier) 17 constituting the correction output generator 14, while being supplied also to a non-inverting input terminal (+) of a comparator 10 constituting the input signal discriminator 13.

A reference voltage $V_{ref}$ is applied to both the non-inverting input terminal (+) of the variable Gm amplifier 17 and the inverting input terminal (−) of the comparator 10, so that the point-A potential is compared with the reference voltage $V_{ref}$. In this embodiment, the reference voltage $V_{ref}$ is set to 2.5 volts for example.

The variable Gm amplifier 17 produces an output current as an error detection signal $S_{12}$ corresponding to the difference between the point-A potential and the reference voltage $V_{ref}$, and then supplies such signal $S_{12}$ to a correction current selector 12 while supplying the same signal also to the reference filter 15 in the input signal detector. The comparator 10 compares the point-A potential with the reference voltage $V_{ref}$ to discriminate whether the subcarrier signal $f_{sc}$ fed to the input terminal $T_{in}$ is based on the NTSC format or the PAL format, and then outputs a discrimination signal $S_{13}$. The discrimination signal $S_{13}$ thus obtained is supplied to the correction current selector 12 to thereby switch the terminal 12a of the selector 12 in accordance with the discriminated content. Therefore, when the subcarrier signal $f_{sc}$ of the PAL format is fed to the input terminal $T_{in}$, the terminal 12a is selectively switched to a PAL current source 12b. Meanwhile, if the subcarrier signal $f_{sc}$ of the NTSC format is fed to the input terminal $T_{in}$, the terminal 12a is selectively switched to an NTSC current source 12c.

Due to execution of such switching control, the correction signal $S_{14}$ conforming with the kind of the input subcarrier signal $f_{sc}$ is outputted from the correction current selector 12. The correction signal $S_{14}$ is supplied to an active filter 20 so that, if the NTSC subcarrier signal or the PAL subcarrier signal is fed to the input terminal $T_{in}$, the center frequency $f_o$ of the active filter is automatically adjusted in conformity therewith.

The active filter 20 comprises a first variable Gm amplifier 21 and a second variable Gm amplifier 22 as shown in FIG. 2, and current sources 23 and 24 for supplying operating currents to such amplifiers are controlled by an operation control signal $S_{14}$ to achieve automatic adjustment of the frequency characteristics.

Figure 3A:
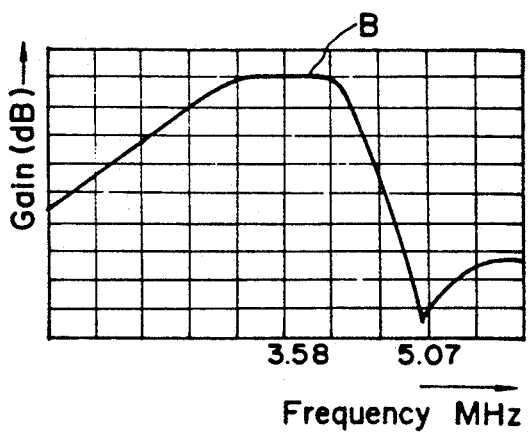
FIGS. 3A and 3B graphically represents the frequency characteristic of the circuit shown in FIG. 2.
Figure 3B:
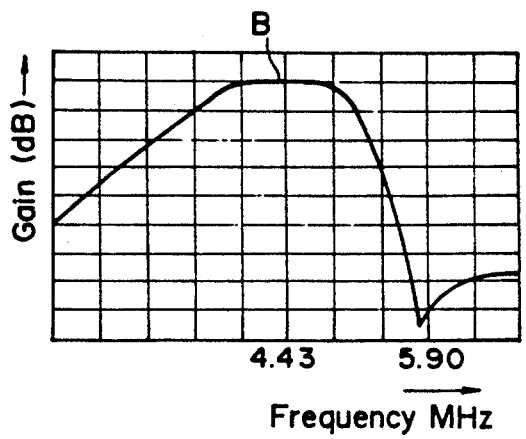

FIGS. 3A and 3B are frequency characteristic diagrams graphically representing the result of measuring the operation of the active filter in the embodiment of the above-described constitution. As obvious from FIGS. 3A and 3B, both the band pass characteristic B and the trap characteristic T of the active filter in the embodiment can be automatically adjusted with accuracy. When the NTSC subcarrier signal $f_{sc}$ is input, the band pass characteristic B is so adjusted as to pass the signal of 3.58 MHz, and the trap characteristic T is automatically adjusted for switching the trap frequency to 5.07 MHz.

Meanwhile, if the PAL subcarrier signal $f_{sc}$ is input, the band pass characteristic B is so adjusted as to pass the signal of 4.43 MHz, and the trap characteristic T is automatically adjusted for switching the trap frequency $f_o$ to 5.90 MHz. In case the operation of the active filter 20 is set ready for input of the NTSC subcarrier signal $f_{sc}$, if the signal $f_{sc}$ fed to the input terminal $T_{in}$ is switched from the NTSC to the PAL when the correction current circuit is not in its operating state, then the trap frequency $f_{Trap}$ of the trap is expressed as $$f_{Trap} = 5.07 \times 4.43/3.58 = 6.27 MHz \quad (2)$$

It is therefore found that, in the circuit of this embodiment, the trap frequency is automatically corrected by 370 kHz.

Figure 4:
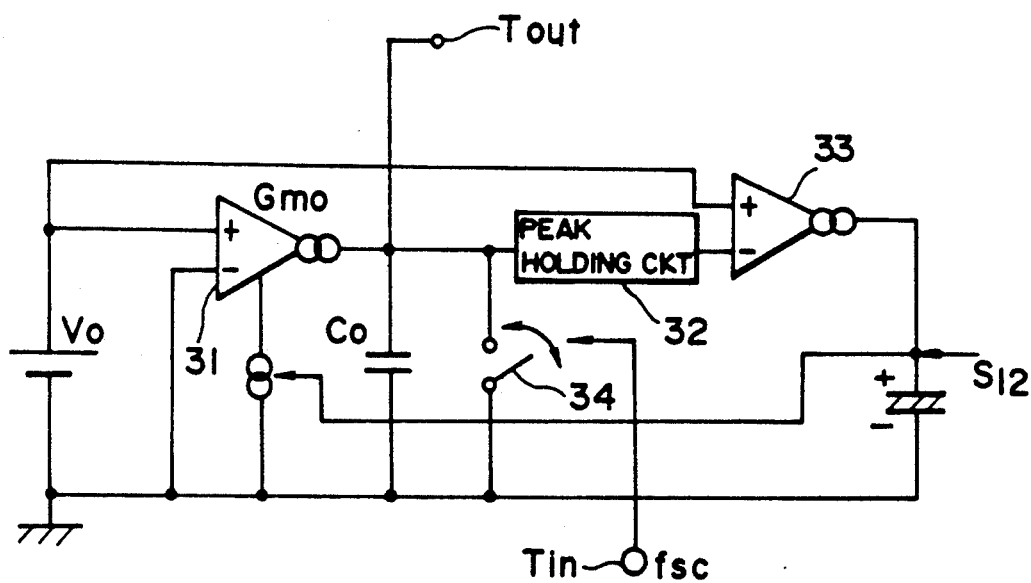
FIG. 4 is a circuit block diagram of a modified input signal detector employed in the circuit of FIG. 2.

The above embodiment represents an exemplary case where the input signal detector 11 is composed of a reference filter 15 and a phase detector 16. However, as shown in FIG. 4 which represents a modified constitution, the input signal detector may be composed of a variable Gm amplifier 31, a peak holder 32, a comparator 33, a switching circuit 34 and a charge/discharge capacitor $C_o$. Briefly describing the operation of this input signal detector, one charge and discharge cycle is repeated every frequency period of the subcarrier signal $f_{sc}$ fed to the input terminal $T_{in}$. And the transconductance of the variable Gm amplifier 31 is so controlled that the amplitude of each triangular wave obtained from an output terminal $T_{out}$ is maintained at a predetermined constant voltage conforming with the frequency of the input subcarrier signal $f_{sc}$. Consequently, in this circuit also, a discrimination between two input subcarrier signals of the NTSC and PAL formats can be executed by detecting the amplitude of the triangular wave.

According to the present invention, as described hereinabove, a signal of an amplitude corresponding to the frequency of an input signal is generated, and a discrimination between subcarrier signals $f_{sc}$ of the NTSC and PAL formats is executed in accordance with the amplitude of the signal thus generated. And then a correction signal conforming with the kind of input subcarrier signal $f_{sc}$ is produced in accordance with the discrimination output. Therefore, if the subcarrier signal $f_{sc}$ supplied as a reference signal to the input terminal is based on the NTSC format or the PAL format, it is possible, by the use of such correction signal, to automatically perform various operations inclusive of controlling the action of the circuit to generate a voltage corresponding to the input signal frequency, adjusting the trap and center frequency of the active filter, and switching the operation mode of the chrominance synchronizing circuit and so forth. Consequently, even in case the circuits are formed to be employed in common to both the NTSC and PAL systems, satisfactory operations are achievable therein without the necessity of supplying any external switching signal.

What is claimed is:

1. An active filter with a signal discriminating circuit comprising:

means for generating a signal having an amplitude level proportional to the frequency of a signal input thereto and discriminating, in response to the amplitude of the signal thus generated, whether said input signal is a subcarrier signal of the NTSC format or a subcarrier signal of the PAL format and producing a discrimination output indicative thereof; and means for producing a correction signal for adjusting the trap center frequency of said active filter in accordance with said discrimination output and for varying the value of the correction signal;

wherein automatic adjustment of the active filter is executed in each mode of the NTSC and PAL signals.

2. A signal discriminating circuit comprising:

an input signal detector for producing a detection signal having a first level in response to a subcarrier signal of the NTSC format input thereto and having a second level in response to a subcarrier signal of the PAL format input thereto;

a correcting circuit for forming a correction difference signal by comparing the detection signal from said input signal detector with a preset reference voltage and feeding back the correction difference signal to said input signal detector for controlling the operation of said input signal detector;

a circuit for comparing the detection signal from said input signal detector with the preset reference voltage and discriminating, in accordance with the result of such comparison, whether the input signal supplied to said input signal detector is a subcarrier signal of the NTSC format or a subcarrier signal of the PAL format; and a current source controlled by said correcting circuit and said comparing circuit.

3. A signal discriminating circuit according to claim 2, wherein said current source selectively outputs predetermined amounts of current.

4. A signal discriminating circuit according to claim 3, wherein said predetermined amounts of current are selectively supplied to an active filter to adjust the trap and center frequency of the active filter.

5. An active filter with a signal discriminating circuit comprising:

an input signal detector for producing a detection signal having a first level in response to a subcarrier signal of the NTSC format input thereto and having a second level in response to a subcarrier signal of the PAL format input thereto:

a correcting circuit for forming a correction difference signal by comparing the detection signal from said input signal detector with a preset reference voltage and feeding back the correction difference signal to said input signal detector for controlling the operation of said input signal detector;

a circuit for comparing the detection signal from said input signal detector with the preset reference voltage and discriminating, in accordance with the result of such comparison, whether the input signal supplied to said input signal detector is a subcarrier signal of the NTSC format or a subcarrier signal of the PAL format; and means for producing an adjusting signal for adjusting the trap center frequency of the active filter in response an output from said circuit for comparing and varying said adjusting signal in response to said correction difference signal from said correcting circuit.

6. A signal discriminating circuit according to claim 5, wherein said input signal detector comprises:

a first voltage-to-current converter supplied with a first reference voltage at a non-inverting input terminal and also with a second reference voltage at an inverting input terminal, and producing an output current controlled by said correction difference signal;

a peak holder having an input supplied with the output current of said first voltage-to-current converter and serving to hold the peak value of said current;

a second voltage-to-current converter supplied with the output signal of said peak holder at an inverting input terminal and with said first reference voltage at a non-inverting input terminal;

a capacitor for holding the output current of said second voltage-to-current converter;

an output terminal for delivering a control voltage therefrom connected to said output current from said first voltage-to-current converter in response to the output signal of said second voltage-to-current converter;

a charge/discharge capacitor connected between the input terminal of said peak holder and the second reference potential; and a switching circuit for selectively connecting said input of said peak holder to ground potential in response to the input signal.

7. A signal discriminating circuit according to claim 6, wherein the input signal for controlling the action of said switching circuit is a video subcarrier signal.

* * * * *